US011974471B2

(12) United States Patent
Zhao et al.

(10) Patent No.: US 11,974,471 B2
(45) Date of Patent: Apr. 30, 2024

(54) DISPLAY PANEL HAVING A GATE DRIVING DEVICE AND SOURCE DRIVING DEVICE ON DIFFERENT SUBSTRATES

(71) Applicant: Wuhan China Star Optoelectronics Semiconductor Display Technology Co., Ltd., Hubei (CN)

(72) Inventors: Huihui Zhao, Hubei (CN); Wenxu Xianyu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 654 days.

(21) Appl. No.: 17/058,150

(22) PCT Filed: Jul. 20, 2020

(86) PCT No.: PCT/CN2020/103058
§ 371 (c)(1),
(2) Date: Nov. 24, 2020

(87) PCT Pub. No.: WO2021/258457
PCT Pub. Date: Dec. 30, 2021

(65) Prior Publication Data
US 2022/0190074 A1 Jun. 16, 2022

(30) Foreign Application Priority Data

Jun. 22, 2020 (CN) .......................... 202010571270.3

(51) Int. Cl.
*H10K 59/127* (2023.01)
*H10K 50/844* (2023.01)
(Continued)

(52) U.S. Cl.
CPC ....... *H10K 59/1275* (2023.02); *H10K 50/844* (2023.02); *H10K 50/86* (2023.02);
(Continued)

(58) Field of Classification Search
CPC .................................................. H10K 59/1275
(Continued)

(56) References Cited

U.S. PATENT DOCUMENTS 8,878,167 B2   11/2014  Jun et al.
2012/0074409 A1  3/2012  Matsumoto et al.
(Continued)

FOREIGN PATENT DOCUMENTS

CN   102573164   7/2012
CN   104867450   8/2015
(Continued)

OTHER PUBLICATIONS

International Search Report and the Written Opinion dated Mar. 10, 2021 From the International Searching Authority Re. Application No. PCT/CN2020/103058 and Its Translation Into English. (15 Pages).
(Continued)

*Primary Examiner* — Long D Pham

(57) ABSTRACT

The present disclosure provides a display panel and a display device. The display panel includes a first substrate, a first driving circuit layer located on the first substrate, a second substrate located on the first driving circuit layer, and a second driving circuit layer located on the second substrate, and a pixel electrode layer located on the second driving circuit layer.

18 Claims, 3 Drawing Sheets

(51) Int. Cl.
*H10K 50/86* (2023.01)
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02); *H10K 2102/351* (2023.02)

(58) Field of Classification Search
USPC ........................................................ 345/204
See application file for complete search history.

(56) References Cited

U.S. PATENT DOCUMENTS

| | | | | |
|---|---|---|---|---|
| 2012/0300042 | A1* | 11/2012 | Yun | H04N 13/305 349/200 |
| 2015/0206928 | A1* | 7/2015 | Kimura | H10K 59/124 257/88 |
| 2015/0382446 | A1* | 12/2015 | Kwon | G06F 1/1643 174/251 |
| 2019/0043420 | A1 | 2/2019 | Jung | |

FOREIGN PATENT DOCUMENTS

| | | |
|---|---|---|
| CN | 106662783 | 5/2017 |
| CN | 107256870 | 10/2017 |
| CN | 109192751 | 1/2019 |
| CN | 109390377 | 2/2019 |
| CN | 109857279 | 6/2019 |
| CN | 110211525 | 9/2019 |
| CN | 110335547 | 10/2019 |
| JP | 5982094 | 8/2016 |
| JP | 2016-186634 | 10/2016 |
| JP | 2017-015938 | 1/2017 |
| WO | WO 2019/215530 | 11/2019 |
| WO | WO 2019/220278 | 11/2019 |

OTHER PUBLICATIONS

Notice of Reasons for Refusal dated Oct. 17, 2022 From the Japan Patent Office Re. Application No. 2021-542514 and Its Translation Into English. (6 Pages).

Notice of Reasons for Refusal dated Apr. 24, 2023 From the Japan Patent Office Re. Application No. 2021-542514 and Its Translation Into English. (8 Pages).

Notification of Office Action and Search Report dated Mar. 25, 2021 From The State Intellectual Property Office of the People's Republic of China Re. Application No. 202010571270.3 and Its Translation Into English. (15 Pages).

Request for the Submission of an Opinion dated Jul. 7, 2023 From the Korean Intellectual Property Office Re. Application No. 10-2021-7015774 and Its Translation Into English. (12 Pages).

* cited by examiner

DISPLAY PANEL HAVING A GATE DRIVING DEVICE AND SOURCE DRIVING DEVICE ON DIFFERENT SUBSTRATES

RELATED APPLICATIONS

This application is a National Phase of PCT Patent Application No. PCT/CN2020/103058 having International filing date of Jul. 20, 2020, which claims the benefit of priority of Chinese Patent Application No. 202010571270.3 filed on Jun. 22, 2020. The contents of the above applications are all incorporated by reference as if fully set forth herein in their entirety.

FIELD AND BACKGROUND OF THE INVENTION

The present disclosure relates to a field of display, and more particularly, to a display panel and a display device.

With developments of technology in a display industry, users have higher and higher requirements for designs of display panels, such as designs of narrow bezels.

Lower bezels of display panels of conventional mobile phones generally use a chip on FPC (COF) or a chip on Pi (COP) process to arrange a position of a driving chip, such that spacing of the lower bezels of the display panels are small. However, a bending portion and GOA circuits located on both lateral sides of the display panel still occupy certain spacing, so that reduction of the bezel can not be further realized.

Therefore, a display panel is extremely needed to solve the above technical problems.

Technical Problems

The present disclosure provides a display panel and a display device to solve the technical problem that the bezel spacing of the conventional display panel is too large.

SUMMARY OF THE INVENTION

Technical Solutions

The present disclosure provides a display panel, including: a first substrate, a first driving circuit layer located on the first substrate, a second substrate located on the first driving circuit layer, a second driving circuit layer located on the second substrate, and a pixel electrode layer located on the second driving circuit layer; wherein orthographic projections of a gate driving device and a source driving device in the first driving circuit layer projected on the first substrate are located within a display area of the display panel.

In the display panel provided in the present disclosure, the first driving circuit layer includes the gate driving device located on at least one side of the display panel, the gate driving device includes at least one gate driving unit, and one said gate driving unit is electrically connected to at least one scanning line of the second driving circuit layer by a plurality of first via holes; the second driving circuit layer includes the source driving device located on at least one side of the display panel, the source driving device includes at least one source driving unit, and one said source driving unit is electrically connected to at least one data line of the second driving circuit layer by a plurality of second via holes; wherein, the first via holes and the second via holes pass through the second substrate and a portion of the second driving circuit layer.

In the display panel provided in the present disclosure, the second driving circuit layer includes an active layer located on the second substrate, a gate insulating layer located on the active layer, a gate layer located on the gate insulating layer, an inter-insulation layer located on the gate layer, a source-drain layer located on the inter-insulation layer, and a planarization layer located on the source-drain layer; wherein the first via holes pass through the gate insulating layer and the second substrate, and the second via holes pass through the inter-insulating layer, the gate insulating layer and the second substrate.

In the display panel provided in the present disclosure, the first via holes and the second via holes are positioned near an edge of the display panel.

In the display panel provided in the present disclosure, the display panel further includes first fan-out traces connecting the gate driving device and a binding layer of the display panel, and second fan-out traces connecting the source driving device and the binding layer of the display panel; the first fan-out traces are electrically connected with the gate driving device by a plurality of third via holes, and the second fan-out traces are electrically connected to the source driving device by a plurality of fourth via holes; wherein the first fan-out traces and the second fan-out traces are mounted in the first substrate.

In the display device provided in the present disclosure, the third via holes and the fourth via holes pass through the first driving circuit layer and the first substrate.

In the display device provided in the present disclosure, the first driving circuit layer includes a first gate driving device located on a first side of the display panel and a second gate driving device located on a third side of the display panel, and a first source driving device located on a second side of the display panel; an orthographic projection of a binding layer of the display panel on the first driving circuit layer is located within an area which surrounded by the first gate driving device, the second gate driving device, and the first source driving device.

In the display device provided in the present disclosure, the gate driving device and the source driving device are located in a non-pixel area between adjacent pixel units of the display panel.

In the display device provided in the present disclosure, the first substrate and the second substrate are made of flexible materials, and each of the first substrate and the second substrate has a thickness being from 1 micrometer to 10 micrometers.

In the display device provided in the present disclosure, the display panel further includes a light emitting device layer located on the second driving circuit layer, and an encapsulation layer located on the light emitting device layer.

The present disclosure further provides a display device, the display device includes a display panel, and a polarizer layer and a cover layer located on the display panel, the display panel includes a first substrate, a first driving circuit layer located on the first substrate, a second substrate located on the first driving circuit layer, a second driving circuit layer located on the second substrate, and a pixel electrode layer located on the second driving circuit layer; wherein orthographic projections of a gate driving device and a source driving device in the first driving circuit layer projected on the first substrate are located within a display area of the display panel.

In the display device provided in the present disclosure, the first driving circuit layer includes the gate driving device located on at least one side of the display panel, the gate driving device includes at least one gate driving unit, and one said gate driving unit is electrically connected to at least one scanning line of the second driving circuit layer by a plurality of first via holes; the second driving circuit layer includes the source driving device located on at least one side of the display panel, the source driving device includes at least one source driving unit, and one said source driving unit is electrically connected to at least one data line of the second driving circuit layer by a plurality of second via holes; wherein, the first via holes and the second via holes pass through the second substrate and a portion of the second driving circuit layer.

In the display device provided in the present disclosure, the second driving circuit layer includes an active layer located on the second substrate, a gate insulating layer located on the active layer, a gate layer located on the gate insulating layer, an inter-insulation layer located on the gate layer, a source-drain layer located on the inter-insulation layer, and a planarization layer located on the source-drain layer; wherein the first via holes pass through the gate insulating layer and the second substrate, and the second via holes pass through the inter-insulating layer, the gate insulating layer and the second substrate.

In the display device provided in the present disclosure, the first via holes and the second via holes are positioned near an edge of the display panel.

In the display device provided in the present disclosure, the display panel further includes first fan-out traces connecting the gate driving device and a binding layer of the display panel, and second fan-out traces connecting the source driving device and the binding layer of the display panel; the first fan-out traces are electrically connected with the gate driving device by a plurality of third via holes, and the second fan-out traces are electrically connected to the source driving device by a plurality of fourth via holes; wherein the first fan-out traces and the second fan-out traces are mounted in the first substrate.

In the display device provided in the present disclosure, the third via holes and the fourth via holes pass through the first driving circuit layer and the first substrate.

In the display device provided in the present disclosure, the first driving circuit layer includes a first gate driving device located on a first side of the display panel and a second gate driving device located on a third side of the display panel, and a first source driving device located on a second side of the display panel; an orthographic projection of a binding layer of the display panel on the first driving circuit layer is located within an area which surrounded by the first gate driving device, the second gate driving device, and the first source driving device.

In the display device provided in the present disclosure, the gate driving device and the source driving device are located in a non-pixel area between adjacent pixel units of the display panel.

In the display device provided in the present disclosure, the first substrate and the second substrate are made of flexible materials, and each of the first substrate and the second substrate has a thickness being from 1 micrometer to 10 micrometers.

In the display device provided in the present disclosure, the display panel further includes a light emitting device layer located on the second driving circuit layer, and an encapsulation layer located on the light emitting device layer.

Beneficial Effect:

The present disclosure removes a source driving device and an gate driving device originally occupying the bezel spacing, and realizes the narrow bezel design of the display panel by disposing the gate driving device and the source driving device of the display panel below the array driving layer of the display panel, and making the orthographic projections of the gate driving device and the source driving device projected on the first substrate be within the display area of the display panel.

DESCRIPTION OF SPECIFIC EMBODIMENTS OF THE INVENTION

Figure 1:
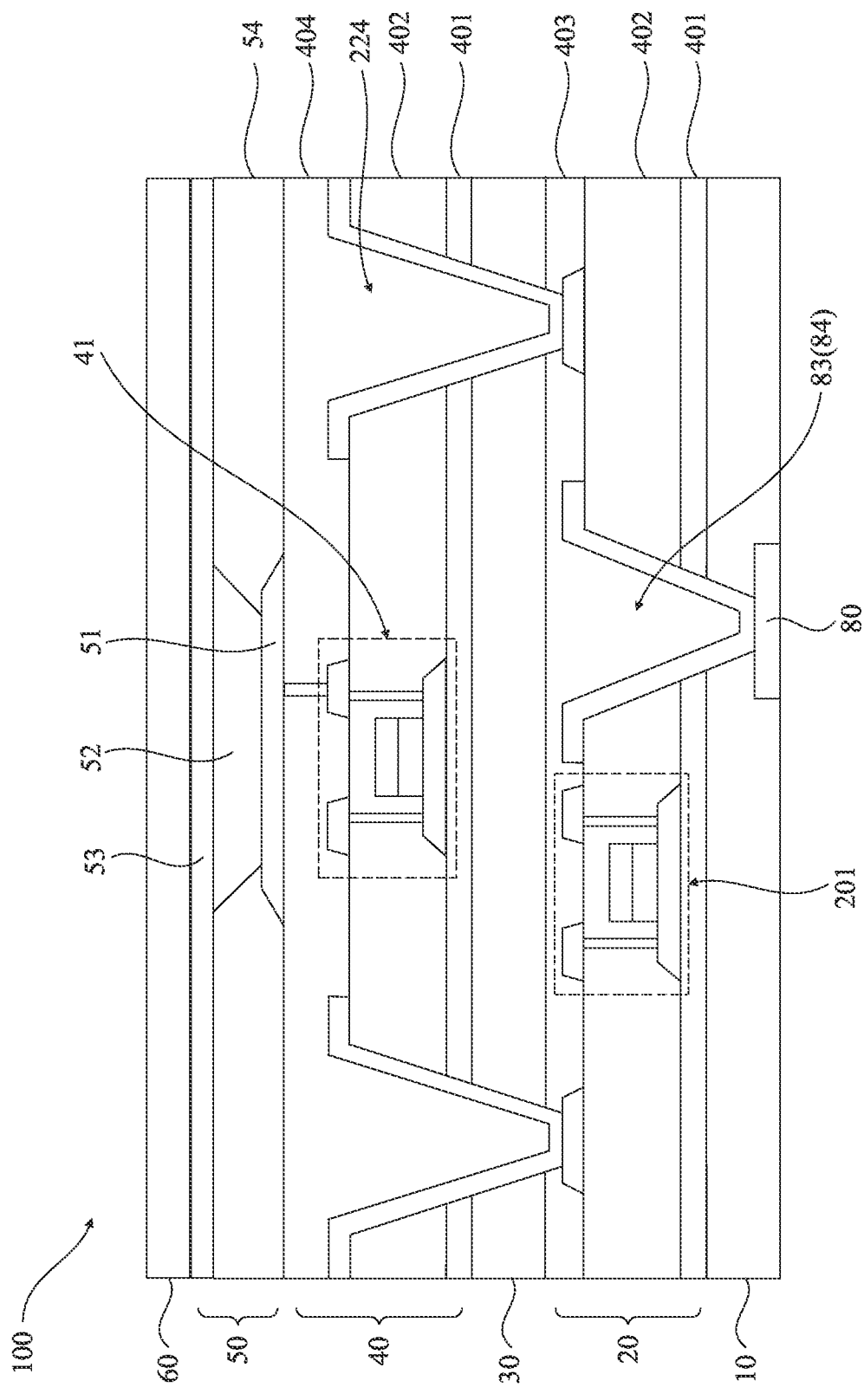
FIG. 1 is a cross-sectional structure diagram of a display panel of the present disclosure.

To clarify the purpose, technical solutions, and effects of the present disclosure, the present disclosure will be further described in detail below with reference to the accompanying drawings and embodiments. It is understood that the specific embodiments described herein are merely illustrative of the present disclosure and are not intended to limit the present disclosure.

Lower bezels of display panels of conventional mobile phones generally use a COF or COP process to arrange a position of a driving chip, so that spacing of the lower bezels of the display panels are small. However, a bending area and GOA circuits on both lateral sides of the display panel still occupy certain spacing, so that reduction of the bezel can not be further realized. The present disclosure provides the following technical solutions to solve the above technical problems.

Referring to FIG. 1 to FIG. 4, the present disclosure provides a display panel 100 including a first substrate 1010, a first driving circuit layer 20 located on the first substrate 10, a second substrate 30 located on the first driving circuit layer 20, a second driving circuit layer 40 located on the second substrate 30, and a pixel electrode layer located on the second driving circuit layer 40;

In the embodiment, the orthographic projections of the gate driving device 21 and the source driving device 22 in the first driving circuit layer 20 projected on the first substrate 10 are within a display area of the display panel 100.

The present disclosure removes a source driving device 22 and a gate driving device 21 originally occupying the bezel spacing, and realizes the narrow bezel design of the display panel 100 by disposing the gate driving device 21 and the source driving device 22 of the display panel 100 below the array driving layer of the display panel 100, and making the orthographic projections of the gate driving device 21 and the source driving device 22 projected on the first substrate 10 be within the display area of the display panel 100.

The technical solution of the present disclosure can be applied to an OLED display panel 100 or an LCD display panel 100. Different types of display panels 100 correspond to different structures. Now, the OLED display panel 100 is taken as an example to describe the technical solution of the present disclosure in connection with specific embodiments.

Referring to FIG. 1, the display panel 100 includes a first substrate 10, a first driving circuit layer 20 located on the first substrate 10, a second substrate 30 located on the first driving circuit layer 20, a second driving circuit layer 40 located on the second substrate 30, a light emitting device layer 50 located on the second driving circuit layer 40, and an encapsulation layer 60 located on the light emitting device layer 50.

In the embodiment, the first substrate 10 and the second substrate 30 may be rigid substrates or flexible substrates. When the first substrate 10 and the second substrate 30 are rigid substrates, the materials of the first substrate 10 and the second substrate 30 may be made of materials such as glass and quartz. When the first substrate 10 and the second substrate 30 are flexible substrates, the first substrate 10 and the second substrate 30 may be materials such as polyimide. In the OLED display panel 100, the substrate structure may be a flexible substrate, which is not described in detail herein.

The second driving circuit layer 40 includes a plurality of second thin film transistors 41. The second thin film transistor 41 may be a structure of an etch barrier type, a back channel etch type, or a top gate thin film transistor type etc., which is not specifically limited. For example, the second thin film transistor 41 of the top gate thin film transistor type may include a buffer layer 401 located on the second substrate 30, an active layer located on the buffer layer 401, a gate insulating layer 402 located on the active layer, a gate layer located on the gate insulating layer 402, an inter-insulating layer 403 located on the gate layer, a source-drain layer located on the inter-insulation layer 403, and a planarization layer 404 located on the source-drain layer.

In the embodiment, the above-mentioned top-gate thin film transistor is not limited to a single-gate structure and can also be configured as a double-gate structure, etc., which is described in detail herein.

Referring to FIG. 1, the light emitting device layer 50 includes an anode layer 51, a light emitting layer 52, and a cathode layer 53 which are formed on the second driving circuit layer 40. The anode layer 51 is the pixel electrode layer described above herein.

The anode layer 51 is formed on the planarization layer 404. The anode layer 51 is mainly used to provide empty holes for absorbing electrons. In the embodiment, a top-emitting OLED device is taken as an example for description, and anode layer 51 may be a non-transparent or transparent metal electrode. The light emitting layer 52 is formed on the anode layer 51. The light-emitting layer 52 is divided into a plurality of light-emitting units by the pixel definition layer 54.

The cathode layer 53 is formed on the light emitting layer 52. The cathode layer 53 covers the light-emitting layer 52 and the pixel define layer 54 located on the planarization layer 404.

In the embodiment, the materials of the anode layer 51 and the cathode layer 53 can be defined according to the light-emitting type of the display panel 100. For example, when the display panel 100 is a top-emission display panel 100, the anode layer 51 may be made of a totally reflective material, and the cathode layer 53 may be made of a semi-reflective material. When the display panel 100 is a bottom-emission display panel 100, the materials of the cathode layer 53 are interchanged with the materials of the anode layer 51.

Wherein, the light emitting device layer 50 forms a microcavity effect by total reflection and semi-reflection of the anode layer 51 and the cathode layer 53 to increase the light emitting efficiency of the light emitting device layer 50.

Since a large number of light-shielding metal layers are disposed in the first driving circuit layer 20, if the display panel 100 is a bottom-emission type, a device to which the first driving circuit layer 20 corresponds can only be disposed in a non-light-transmissive area of the display panel 100, and the display panel 100 being a top-emitting type is not limited by the above. Therefore, the display panel 100 being a top emission type has a larger aperture ratio compared with the display panel 100 being a bottom emission type.

Referring to FIG. 1, the encapsulation layer 60 may be a thin-film encapsulation layer 60, which may include a first inorganic layer, a first organic layer located on the first inorganic layer, and a second inorganic layer located on the first organic layer. The specific structure is the same as or similar to the prior art and is not repeatedly described herein.

Referring to FIG. 1, the first driving circuit layer 20 is located between the first substrate 10 and the second substrate 30. The first driving circuit layer 20 is identical to the second driving circuit layer 40. The first driving circuit layer 20 is also provided with a plurality of first thin film transistors 201. For the structures of the first thin film transistors 201, refer to the second thin film transistor 41 in the second driving circuit layer 40. The structures of the first thin film transistors 201 is not repeatedly described herein.

In this embodiment, a combination of the plurality of first thin film transistors 201 in the first driving circuit layer 20 may constitute a corresponding gate driving device 21 or source driving device 22.

Figure 2:
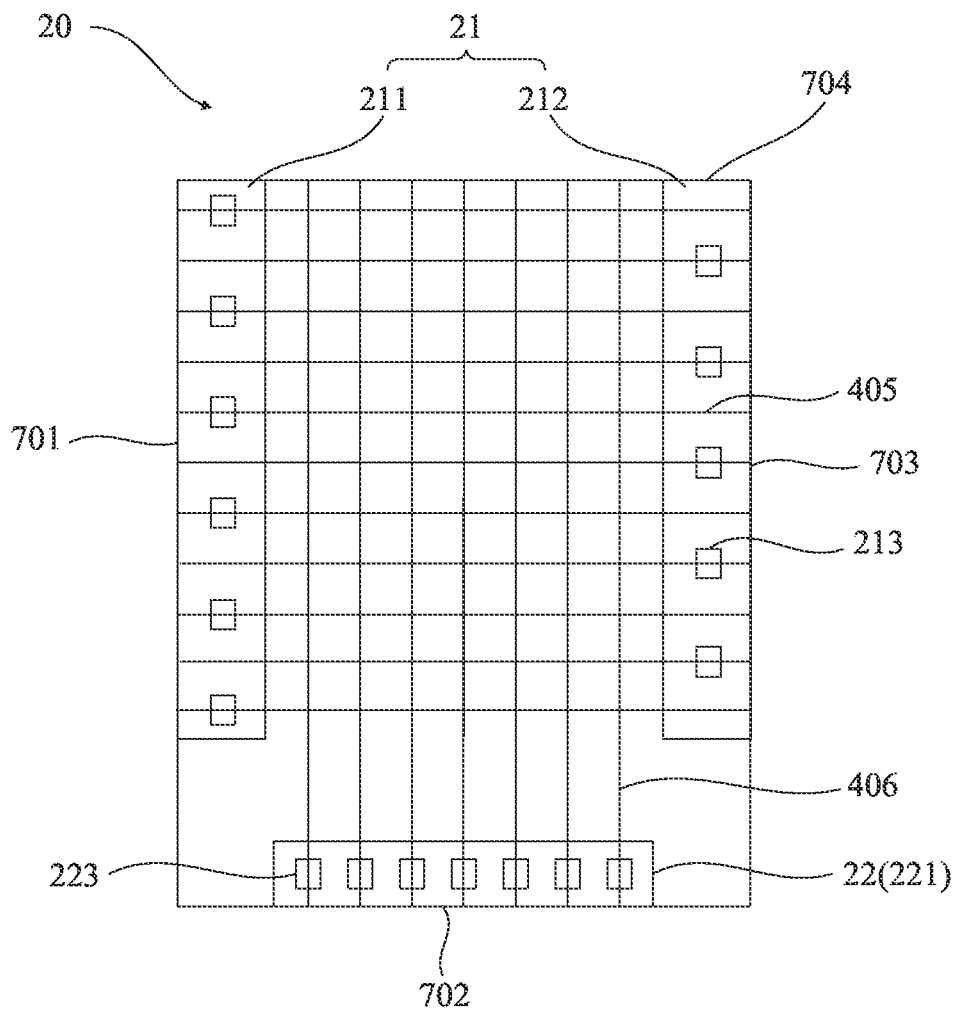
FIG. 2 is a top structural view of the first driving circuit layer of the display panel of the present disclosure.

Referring to FIG. 1 and FIG. 2, the first driving circuit layer 20 includes the gate driving device 21 located on at least one side of the display panel 100. The gate driving device 21 includes at least one gate driving unit 213. One said gate driving unit 213 is electrically connected to at least one scan line 405 of the second driving circuit layer 40 by first via holes 214.

In the embodiment, the first driving circuit layer 20 may include a first gate driving device 211 located on a first side 701 of the display panel 100, and a second gate driving device 212 located on a third side 703 of the display panel 100. A gate driving unit 213 including a plurality of thin film transistors, namely a GOA unit, is disposed within in the first driving gate device and the second driving gate device. The GOA unit can scan one or more scan lines 405 simultaneously. The type of the gate driving unit 213 in the embodiment may be 2T1C, 7T1C, etc. in the prior art, and is not specifically limited herein.

In the embodiment, the first via holes 214 pass through the second substrate 30 and a portion of the second driving circuit layer 40. The first via holes 214 pass through the gate insulating layer 402, the buffer layer 401, and the second substrate 30, such that the scan lines 405 in the gate layer are electrically connected with the gate driving device 21 in the first driving circuit layer 20 by the first via holes 214.

Since the left side and the right side of the panel is provided with the gate driving devices 21, the display panel 100 of the embodiment may input scan signals into the panel from the gate driving devices 21 on the both sides, or the first gate driving device 211 may be used to control the odd rows of scan lines 405, and the second gate driving device 212 is used to control the even rows of scan lines 405, etc. The specific scanning method is not introduced in detail in the present disclosure.

Referring to FIG. 1 and FIG. 2, the second driving circuit layer 40 includes the source driving device 22 located on at least one side of the display panel 100. The source driving device 22 includes at least one source driving unit 223, and one said source driving unit 223 is electrically connected with at least one data line 406 of the second driving circuit layer 40 by a second via hole 224.

In the embodiment, the first side 701 and the third side 703 may be side bezels of the display panel 100, which are disposed oppositely. The display panel 100 further includes a second side 702 and a fourth side 704 disposed opposite the second side 702. The second side 702 and the fourth side 704 may be an upper bezel and a bottom bezel.

In the embodiment, the first driving circuit layer 20 may include a first source driving device 221 located on the second side 702 of the display panel 100. The data lines 406 of the display panel 100 extend along the direction of the first side 701 or the direction of the third side 703 toward the second side 702, and are electrically connected with the first source driving device 221 by the second via holes 224. The source driving units 223 in the first source driving device 221 may be electrically connected to at least one data line 406.

In the embodiment, the first driving circuit layer 20 may further include a second source driving device 22 located on the fourth side 704 of the display panel 100. Some of the data lines 406 are electrically connected with the first source driving device 221, and some of the data lines 406 are electrically connected with the second source driving device 22. The first source driving units 223 and the second source driving units 223 do not interfere with each other.

In the embodiment, the second via holes 224 pass through the second substrate 30 and a portion of the second driving circuit layer 40. The second via holes 224 pass through the inter-insulating layer 403, the gate insulating layer 402, the buffer layer 401, and the second substrate 30, so that the data lines 406 in the source-drain layer are electrically connected to the source driving device 22 in the first driving circuit layer 20 by the second via holes 224.

Referring to FIG. 2, the first via holes 214 and the second via holes 224 may be disposed near the edge of the display panel 100. The first via holes 214 and the second via holes 224 which are disposed at the edge of the display panel 100 may avoid the influence of the via holes on the internal structure of the panel.

Figure 3:
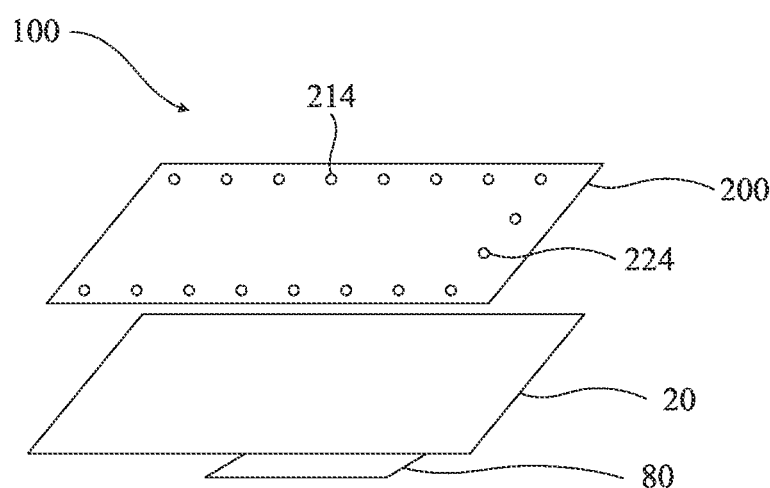
FIG. 3 is a schematic diagram of the layered structure of the display panel of the present disclosure.

Referring to FIG. 1 and FIG. 3, the display panel 100 may include a display layer 200 located on the first driving circuit layer 20, and a binding layer 80 located on a side of the first driving circuit layer 20 away from the display layer 200. The binding layer 80 is located in the first substrate 10 or located on a side of the first substrate 10 away from the light emitting device layer 50.

In the embodiment, the orthographic projection of the binding layer 80 on the first driving circuit layer 20 is within an area which surrounded by the first gate driving device 211, the second gate driving device 212, and the first source driving device 221 or/and the second source driving device 22.

Figure 4:
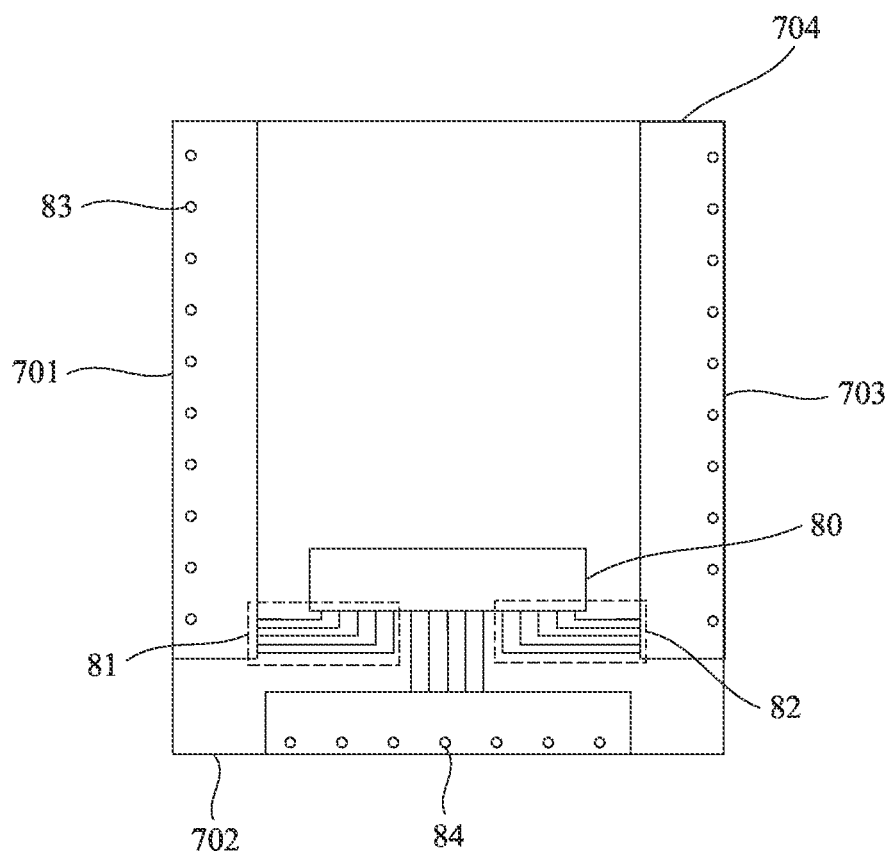
FIG. 4 is a structurally schematic diagram of a binding layer of the display panel of the present disclosure.

Referring to FIG. 4, the display panel 100 further includes first fan-out traces 81 connecting the gate driving device 21 with the binding layer 80 of the display panel 100, and the second fan-out traces 82 connecting the source driving device 22 with the binding layer 80 of the display panel 100.

In the embodiment, the first fan-out traces 81 are electrically connected with the gate driving device 21 by third via holes 83, and the second fan-out traces 82 are electrically connected with the source driving device 22 by fourth via holes 84.

In the embodiment, in order to prevent the first fan-out traces 81 and the second fan-out traces 82 from being short-circuited with each signal line in the first driving layer, the first fan-out traces 81 and the second fan-out traces 82 may be mounted on the same layer as the binding layer 80.

Referring to FIG. 1, the first fan-out traces 81 and the second fan-out traces 82 may be mounted in the first substrate 10. The third via holes 83 and the fourth via holes 84 pass through the first driving circuit layer 20 and the first substrate 10.

Referring to FIG. 4, the first fan-out traces 81 may extend along the bottom end of the gate driving device 21 near the second side 702 toward a first terminal area of the bonding layer 80, and be insulated from the second fan-out traces 82.

In the embodiment, the first fan-out traces 81 may extend from the bottom end of the gate driving device 21 near the fourth side 704 toward a second terminal area of the binding area. The technical solution of the embodiment can increase spacing between the signal lines in the first fan-out traces 81 and the second fan-out traces 82, thereby reducing the process and accuracy of the first fan-out traces 81 and the second fan-out traces 82, and preventing the signal lines from a technical problem of short circuit.

For the conventional narrow-bezel flexible display panel 100, generally by bending the bottom bezel of the display panel 100 toward a side of the display panel 100 away from the light-emitting layer 52, the driver ICs or display ICs on the panel are disposed using a space in the back of the display panel 100 to reduce the lower bezel of the display panel 100. However, since the bending structure of the flexible display panel 100 still has a certain bending radius, spacing of the lower bezel of the display panel 100 cannot be eliminated.

The binding layer 80 of the embodiment is disposed on a side of the first substrate 10 away from the light emitting layer 52 of the display panel 100, such that the source driving device 22 and the gate driving device 21 of the display panel 100 can be connected with the binding layer 80 by the corresponding via holes, and the corresponding data signals are input or output directly from the bottom of the display panel 100, thereby eliminating the spacing of the lower bezel of the panel, and it can be realized that the spacing of the lower bezel of the display panel 100 is 0.

In the above embodiment, when the display panel 100 is a bottom-emission type or a LCD display panel 100, the gate driving device 21 and the source driving device 22 may be located in a non-pixel area between adjacent pixel units of the display panel 100. The light emitted by the light-emitting layer 52, or the light source of the backlight module is avoided from being blocked by the corresponding gate driving device 21 and the source driving device 22.

In the above embodiment, each of the first substrate 10 and the second substrate 30 has a thickness being from 1 micrometer to 10 micrometers. Since the technical solution of the embodiment needs to prepare the thin film transistor on or in the flexible substrate, a certain thickness basis can ensure the planarization of the panel during a manufacturing process. In addition, the flexible substrate can also increase the bending ability or stress relief etc. of the panel.

In the above embodiment, the data lines 406 or the scan lines 405 are electrically connected with the source and drain of each driving device in the first driving circuit layer 20 by corresponding via holes, and then transmitted to the bonding layer 80 by the signal lines in the same layer as the source and drain layers in the first driving circuit layer 20. In addition, the present disclosure is only illustrated with the above connection method as an example. Regarding the transmission of data signals, the metal layers, such as the gate layer and the active layer, in the first thin film transistor 201 can be functioned as the transmission layers of the data signals, and are not limited to the above-mentioned embodiments of the present disclosure.

The present disclosure removes a source driving device 22 and a gate driving device 21 originally occupying the bezel spacing, thereby realizing the narrow bezel design of the display panel 100, and may make the entire surface of the display panel be a display area, by disposing the gate driving device 21 and the source driving device 22 of the display panel 100 below the array driving layer of the display panel 100, and make the orthographic projections of the gate driving device 21 and the source driving device 22 projected on the first substrate 10 be within the display area of the display panel 100.

The present disclosure also provides a display device, wherein the display device includes the above-mentioned display panel, a polarizer layer and a cover layer which are located on the display panel. The working principle of the display device in the embodiment is the same as or identical to the working principle of the above-mentioned display panel, and is not repeatedly described herein.

The present disclosure provides a display panel and a display device. The display panel includes a first substrate, a first driving circuit layer located on the first substrate, a second substrate located on the first driving circuit layer, a second driving circuit layer on the second substrate and a pixel electrode layer located on the second driving circuit layer. The present disclosure removes a source driving device and a gate driving device originally occupying the bezel spacing, and realizes the narrow bezel design of the display panel by disposing the gate driving device and the source driving device of the display panel below the array driving layer of the display panel, and making the orthographic projection of the gate driving device and the source driving device projected on the first substrate be within the display area of the display panel.

It can be understood that, equivalent replacements or changes can be made according to the technical solutions and inventive concepts of the present disclosure for a person of ordinary skill in the art, and all these changes or replacements should fall within the protection scope of the claims appended to the present disclosure.

What is claimed is:

1. A display panel, comprising:
a first substrate, a first driving circuit layer located on the first substrate, a second substrate located on the first driving circuit layer, a second driving circuit layer located on the second substrate, and a pixel electrode layer located on the second driving circuit layer;
wherein orthographic projections of a gate driving device and a source driving device in the first driving circuit layer projected on the first substrate are located within a display area of the display panel;
wherein the first driving circuit layer includes the gate driving device located on at least one side of the display panel, the gate driving device includes at least one gate driving unit, and one said gate driving unit is electrically connected to at least one scanning line of the second driving circuit layer by a plurality of first via holes; the second driving circuit layer includes the source driving device located on at least one side of the display panel, the source driving device includes at least one source driving unit, and one said source driving unit is electrically connected to at least one data line of the second driving circuit layer by a plurality of second via holes; wherein, the first via holes and the second via holes pass through the second substrate and a portion of the second driving circuit layer.

2. The display panel according to claim 1, wherein the second driving circuit layer includes an active layer located on the second substrate, a gate insulating layer located on the active layer, a gate layer located on the gate insulating layer, an inter-insulation layer located on the gate layer, a source-drain layer located on the inter-insulation layer, and a planarization layer located on the source-drain layer;
wherein the first via holes pass through the gate insulating layer and the second substrate, and the second via holes pass through the inter-insulating layer, the gate insulating layer and the second substrate.

3. The display panel according to claim 1, wherein the first via holes and the second via holes are positioned near an edge of the display panel.

4. The display panel according to claim 1, wherein the display panel further includes first fan-out traces connecting the gate driving device and a binding layer of the display panel, and second fan-out traces connecting the source driving device and the binding layer of the display panel;
the first fan-out traces are electrically connected with the gate driving device by a plurality of third via holes, and the second fan-out traces are electrically connected to the source driving device by a plurality of fourth via holes;
wherein the first fan-out traces and the second fan-out traces are mounted in the first substrate.

5. The display panel according to claim 4, wherein the third via holes and the fourth via holes pass through the first driving circuit layer and the first substrate.

6. The display panel according to claim 1, wherein the first driving circuit layer includes a first gate driving device located on a first side of the display panel and a second gate driving device located on a third side of the display panel, and a first source driving device located on a second side of the display panel;
an orthographic projection of a binding layer of the display panel on the first driving circuit layer is located within an area which surrounded by the first gate driving device, the second gate driving device, and the first source driving device.

7. The display panel according to claim 1, wherein the gate driving device and the source driving device are located in a non-pixel area between adjacent pixel units of the display panel.

8. The display panel according to claim 1, wherein the first substrate and the second substrate are made of flexible materials, and each of the first substrate and the second substrate has a thickness being from 1 micrometer to 10 micrometers.

9. The display panel according to claim 1, wherein the display panel further includes a light emitting device layer located on the second driving circuit layer, and an encapsulation layer located on the light emitting device layer.

10. A display device, comprising:
a display panel, and a polarizer layer and a cover layer located on the display panel, the display panel includes a first substrate, a first driving circuit layer located on the first substrate, a second substrate located on the first driving circuit layer, a second driving circuit layer located on the second substrate, and a pixel electrode layer located on the second driving circuit layer;
wherein orthographic projections of a gate driving device and a source driving device in the first driving circuit layer projected on the first substrate are located within a display area of the display panel;
wherein the first driving circuit layer includes the gate driving device located on at least one side of the display panel, the gate driving device includes at least one gate driving unit, and one said gate driving unit is electrically connected to at least one scanning line of the second driving circuit layer by a plurality of first via holes; the second driving circuit layer includes the source driving device located on at least one side of the display panel, the source driving device includes at least one source driving unit, and one said source driving unit is electrically connected to at least one data line of the second driving circuit layer by a plurality of second via holes; wherein, the first via holes and the second via holes pass through the second substrate and a portion of the second driving circuit layer.

11. The display device according to claim 10, wherein the second driving circuit layer includes an active layer located on the second substrate, a gate insulating layer located on the active layer, a gate layer located on the gate insulating layer, an inter-insulation layer located on the gate layer, a source-drain layer located on the inter-insulation layer, and a planarization layer located on the source-drain layer;

wherein the first via holes pass through the gate insulating layer and the second substrate, and the second via holes pass through the inter-insulating layer, the gate insulating layer and the second substrate.

12. The display device according to claim 10, wherein the first via holes and the second via holes are positioned near an edge of the display panel.

13. The display device according to claim 10, wherein the display panel further includes first fan-out traces connecting the gate driving device and a binding layer of the display panel, and second fan-out traces connecting the source driving device and the binding layer of the display panel;

the first fan-out traces are electrically connected with the gate driving device by a plurality of third via holes, and the second fan-out traces are electrically connected to the source driving device by a plurality of fourth via holes;

wherein the first fan-out traces and the second fan-out traces are mounted in the first substrate.

14. The display device according to claim 13, wherein the third via holes and the fourth via holes pass through the first driving circuit layer and the first substrate.

15. The display device according to claim 10, wherein the first driving circuit layer includes a first gate driving device located on a first side of the display panel and a second gate driving device located on a third side of the display panel, and a first source driving device located on a second side of the display panel;

an orthographic projection of a binding layer of the display panel on the first driving circuit layer is located within an area which surrounded by the first gate driving device, the second gate driving device, and the first source driving device.

16. The display device according to claim 10, wherein the gate driving device and the source driving device are located in a non-pixel area between adjacent pixel units of the display panel.

17. The display device according to claim 10, wherein the first substrate and the second substrate are made of flexible materials, and each of the first substrate and the second substrate has a thickness being from 1 micrometer to 10 micrometers.

18. The display device according to claim 10, wherein the display panel further includes a light emitting device layer located on the second driving circuit layer, and an encapsulation layer located on the light emitting device layer.

* * * * *